(12) United States Patent
Tamma

(10) Patent No.: US 11,430,919 B2
(45) Date of Patent: Aug. 30, 2022

(54) HIGH BRIGHTNESS LEDS WITH NON-SPECULAR NANOSTRUCTURED THIN FILM REFLECTORS

(71) Applicant: Lumileds LLC, San Jose, CA (US)

(72) Inventor: Venkata Ananth Tamma, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 76 days.

(21) Appl. No.: 16/857,064

(22) Filed: Apr. 23, 2020

(65) Prior Publication Data

US 2020/0343416 A1 Oct. 29, 2020

Related U.S. Application Data

(60) Provisional application No. 62/839,123, filed on Apr. 26, 2019.

(51) Int. Cl.
*H01L 33/58* (2010.01)
*H01L 33/46* (2010.01)
(Continued)

(52) U.S. Cl.
CPC .............. *H01L 33/46* (2013.01); *H01L 27/15* (2013.01); *H01L 33/10* (2013.01); *H01L 33/32* (2013.01); *H01L 33/58* (2013.01); *H01L 33/60* (2013.01); *H01L 2933/0083* (2013.01); *H01L 2933/0091* (2013.01)

(58) Field of Classification Search
CPC ......... H01L 33/58; H01L 33/60; H01L 33/10; H01L 33/46; H01L 27/15; H01L 33/32; H01L 2933/0083; H01L 2933/0091; G02B 5/085; G02B 1/005; G02B 5/1861; B82Y 20/00
See application file for complete search history.

(56) References Cited

U.S. PATENT DOCUMENTS 10,795,168 B2 * 10/2020 Riley, Jr. ............ G02B 27/0927
11,067,808 B2 * 7/2021 Schmulen ............ G02B 5/1857
(Continued)

FOREIGN PATENT DOCUMENTS

WO 2015/021255 A1 2/2015

OTHER PUBLICATIONS

International Search Report and Written Opinion from the ISA, PCT/US2020/029715, dated Jul. 14, 2020, 11 pages.

*Primary Examiner* — Shouxiang Hu

(57) ABSTRACT

A light emitting device comprises a semiconductor diode structure configured to emit light, a substrate that is transparent to light emitted by the semiconductor diode structure, and a reflective nanostructured layer. The reflective nanostructured layer may be disposed on or adjacent to a bottom surface of the substrate and configured to reflect toward and through a side wall surface of the substrate light that is emitted by the semiconductor structure and incident on the reflective nanostructured layer at angles at or near perpendicular incidence. Alternatively, the reflective nanostructured layer may be disposed on or adjacent to at least one sidewall surface of the substrate and configured to reflect toward and through the bottom surface of the substrate light that is emitted by the semiconductor structure and incident on the reflective nanostructured layer at angles at or near perpendicular incidence.

16 Claims, 11 Drawing Sheets

(51) Int. Cl.
*H01L 27/15* (2006.01)
*H01L 33/32* (2010.01)
*H01L 33/60* (2010.01)
*H01L 33/10* (2010.01)

(56) References Cited

U.S. PATENT DOCUMENTS

2008/0217639 A1* 9/2008 Kim ..................... H01L 33/508
257/98
2019/0113727 A1* 4/2019 Tamma ................... H01L 33/58

* cited by examiner reflective metasurface sapphire semiconductor die/chip reflective metasurface sapphire semiconductor die/chip

HIGH BRIGHTNESS LEDS WITH NON-SPECULAR NANOSTRUCTURED THIN FILM REFLECTORS

CROSS-REFERENCE TO RELATED APPLICATIONS

This application claims benefit of priority to U.S. Provisional Patent Application 62/839,123 filed Apr. 26, 2019, which is incorporated herein by reference in its entirety.

FIELD OF INVENTION

The present invention relates to light emitting diodes (LEDs), and more particularly, to LEDs employing nanostructured thin film reflectors, e.g., reflective metasurfaces, to achieve features such as high brightness and side emission of light

BACKGROUND

In the blue color blue chip scale package (CSP) device, the sapphire is not surrounded, or otherwise coated, by a reflector, or other element, such as a volume scattering material or a diffuse reflector, allowing the light emitting diode (LED) to emit from five sides. In certain applications, five sides of emission are useful. In other applications, the emission from certain sides is wasted. Benefits in some applications are had with emission from four sides (excluding the side opposite from the die), and in others with emission from only a single side opposite to the die.

When side walls of a five-side emitting LED are surrounded, or otherwise coated, by a reflector, or other elements, such as a volume scattering material, dielectric mirror, or Bragg mirror, the LED may be formed as a top sided or directional emitter. Alternatively, a five-side emitting LED may be configured for side light emission, from all four sides or from only a few sides, by coating the sapphire "top," and any of the sides with a reflector. A reflector may take the form of a specular reflector, such as a metal film or a dielectric mirror or Bragg mirror, for example, or a diffusive reflector, such as a volume scattering material, for example.

For a side emitting LED, the height of the sapphire layer may be increased to extract more light from the LED. While side emission is attained when the top sapphire substrate surface is coated with a reflector, as described, a portion of the emission may be reflected back into the LED die. This may occur for example if the reflector is a specular reflector and the emission is incident on the reflector at near normal incidence, or alternatively if the reflector is a diffuse reflector that scatters or redirects incident light into many different angles in addition to the specular angles. A portion of the photons in such a reflected emission may bounce around in the LED device/cavity and be absorbed in the die or other absorption centers, and as a result, fail to contribute the total LED emitted flux. In addition, based on the type of reflector used, additional loses may occur at the reflector. For example, if a metal reflector is utilized, photons may also be absorbed in the metal reflector. Further, if a more diffuse reflector is used, the diffuse reflector requires additional thickness, such as >150 µm) to achieve appropriate reflection of incident photons. Loss also may occur within volume scattering media used as a reflector. Further, volume scattering media may require a greater reflector thickness than desirable.

Similarly to as described above with respect to a side emitting LED, for a top emitting LED light incident on reflective side walls may be reflected back and forth within the LED cavity. A reflected photon may experience multiple bounces which improves it probability of being absorbed in the LED die or by other absorbing materials.

It would be useful to design reflectors to extract light from an LED with a minimal number of bounces/passes within the LED cavity, thereby improving the LED efficiency.

SUMMARY

A light emitting device comprises a semiconductor diode structure configured to emit light, a substrate that is transparent to light emitted by the semiconductor diode structure, and a reflective nanostructured layer. The reflective nanostructured layer may be disposed on or adjacent to a bottom surface of the substrate and configured to reflect toward and through a side wall surface of the substrate light that is emitted by the semiconductor structure and incident on the reflective nanostructured layer at angles at or near perpendicular incidence. Alternatively, the reflective nanostructured layer may be disposed on or adjacent to at least one sidewall surface of the substrate and configured to reflect toward and through the bottom surface of the substrate light that is emitted by the semiconductor structure and incident on the reflective nanostructured layer at angles at or near perpendicular incidence.

The reflective nanostructured layer may comprise, for example a specular reflector, a dielectric layer disposed between the specular reflector and the substrate, and a periodic arrangement of nanoantennas disposed between the specular reflector and the substrate and spaced apart from the specular reflector by the dielectric layer. In some variations the reflective nanostructured layer may lack the specular reflector.

Each nanoantenna scatters light asymmetrically. The properties of the individual nanoantenna and their periodic arrangements are chosen such that the direction of outgoing scattered waves can be very different from the direction of incident waves, since the metasurface can be viewed as a grating with sub-wavelength spacing and features. As a consequence, the reflective nanostructured layer reflects incident light non-specularly, that is the angle of incidence and the angle of reflection may be different. Contrast this to the specular behavior of a typical metallic or dielectric Bragg reflector. While a traditional diffuse reflector tends to re-distribute light into all angles, the metasurface instead is chosen to re-distribute light into certain chosen angles which help to improve the performance of the LED.

As used herein, a nanoantenna refers to a single light scatterer, or to an arrangement of two or more light scatters in close proximity to each other, for example at distances from each other comparable to or less than the peak wavelength (in the semiconductor) of light emitted by the semiconductor diode structure.

In the reflective nanostructured layers described herein, a nanontenna may be for example a single asymmetric light scattering object, or comprise two or more light scattering objects arranged asymmetrically. The periodic arrangement of nanoantennas in the disclosed reflective nanostructured layers may comprise nanoantennas that differ in size, shape, or size and shape from each other.

BRIEF DESCRIPTION OF THE DRAWINGS

A more detailed understanding can be had from the following description, given by way of example in conjunction with the accompanying drawings wherein.

DETAILED DESCRIPTION

Figure 1A:
FIG. 1A illustrates a light emitting diode (LED) device with a metasurface positioned optically adjacent to a sapphire layer distal to a semiconductor die or chip.
Figure 1A:
Figure 1A:
Figure 1A:
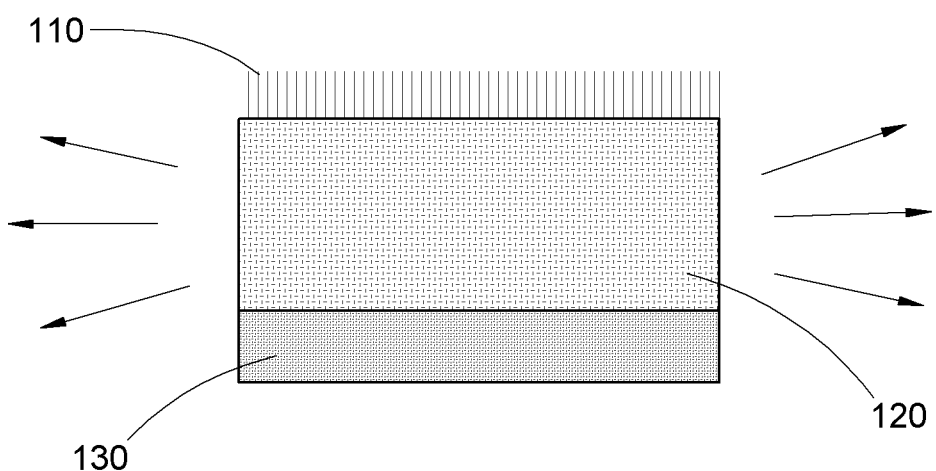

In the following description, numerous specific details are set forth, such as particular structures, components, materials, dimensions, processing steps, and techniques, in order to provide a thorough understanding of the present embodiments. However, it will be appreciated by one of ordinary skill of the art that the embodiments may be practiced without these specific details. In other instances, well-known structures or processing steps have not been described in detail in order to avoid obscuring the embodiments. It will be understood that when an element such as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments in the following detailed description, some structures, components, materials, dimensions, processing steps, and techniques that are known in the art may have been combined together for presentation and for illustration purposes and in some instances may have not been described in detail. In other instances, some structures, components, materials, dimensions, processing steps, and techniques that are known in the art may not be described at all. It should be understood that the following description is rather focused on the distinctive features or elements of various embodiments described herein.

The design and optimization of blue color, direct, side emitting light emitting diode (LED) devices, and top emitting LED devices are disclosed. By way of example and in order to provide concrete description, a chip scale package (CSP) LED with a sapphire slab is described, although the principles and teaching herein may be applied to other LED configurations as well. A side emission LED having a top surface of the sapphire coated with a reflective nanostructured surface, for example a metasurface, provides benefits to solve the problems discussed hereinabove. A top emission LED having the side walls of the sapphire coated with a reflective metasurface provides benefits to solve the problems discussed hereinabove. In either configuration, the reflective metasurface may be designed to bend the incident light towards the exit surface and prevent it from getting back into the die. The use of the reflective metasurface may increase the efficiency of the overall device. In addition, the reflective metasurface acts as a thin reflector, on the order of wavelength of light, and may be designed to provide better reflection compared to an equivalent thickness of volume scatter or lower loss than a metallic reflector.

FIG. 1A illustrates an LED device 100 with a metasurface 110 positioned optically adjacent to a sapphire layer 120 distal to a semiconductor die or chip 130. The metasurface layer may be coupled directly to the LED structure and/or may be placed directly on top of the LED structure (as shown in FIG. 1A) adjacent to the sapphire layer 120, for example. The LED structure may include an LED surface of the sapphire layer 120, which as would be understood, may also be formed for certain wavelength LEDs as gallium nitride (GaN). Device 100 may also include a semiconductor die or chip 130. The LED structure of LED device 100 is presented in a simplified form for ease of understanding of the invention, knowing that one possessing an ordinary skill in the pertinent arts would understand the other elements included within an LED.

At the base of the semiconductor is a substrate, herein referred to as sapphire layer 120. Sapphire is aluminum oxide ($Al_2O_3$), also known as corundum, and exhibits properties including being very hard, strong, easy to machine flat, a good electrical insulator, and an excellent thermal conductor. Sapphire is generally transparent when produced synthetically with the blue color in naturally occurring sapphires (and the red in rubies, which is another form of corundum) comes from impurities in the crystal lattice. Sapphire layer 120 forms part of the structure and can also reflect light rays.

In operation, the chip 130 emits light. For an LED blue emitter, chip 130 may be a CSP die with a smooth top surface of the sapphire layer 120 that may be used as substrate material for the metasurface 110.

Metasurface 110 may take the form of a nanostructured photonic layer designed to steer angular radiation. Metasurface 110 may include or consist of a photonic crystal, metamaterial, metasurface or subwavelength gratings of asymmetric nanoantennas, by way of non-limiting example only. The main function of metasurface 110 is to reflect radiation incident upon the sapphire surface from a given angular range to a chosen angular range. This restricted angular range is chosen to extract as much light as possible from the side(s) of the LED 100. For example, the light incident normally on metasurface 110 may be reflected to large oblique angles such that the light can escape from the sidewall of sapphire layer 120.

Figure 1B:
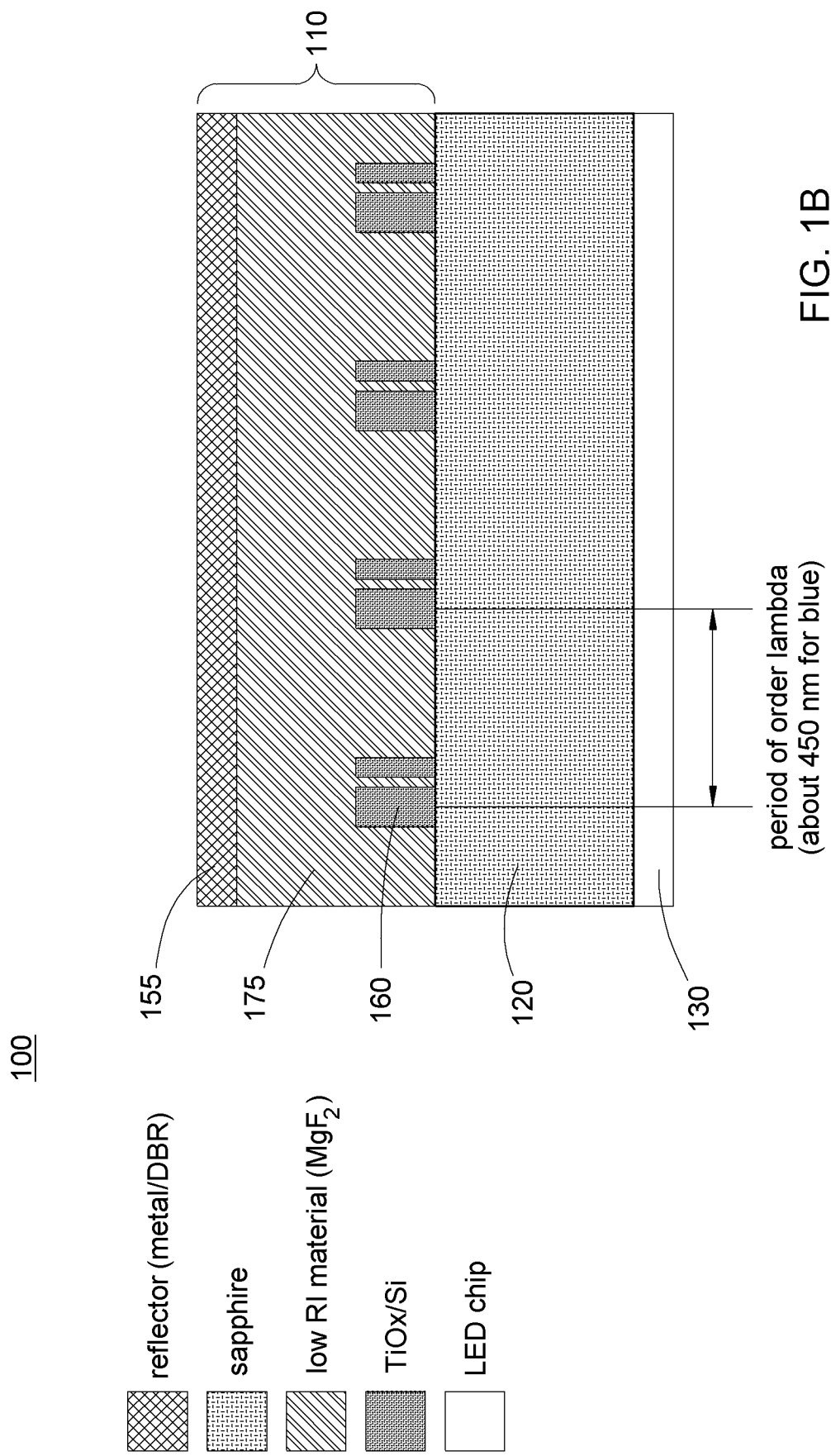
FIG. 1B illustrates an exploded view of an example metasurface as in FIG. 1A.

Metasurface 110 may be composed of reflective beam-benders formed in a periodic two-dimensional pattern or grating, for example. FIG. 1B illustrates an exploded view of LED device 100 FIG. 1A illustrating details of the metasurface 110. Metasurface 110 may be formed of background material 175 encapsulating or otherwise containing a plurality of scattering elements 160 and positioned adjacent to sapphire layer 120. The plurality of scattering elements 160 may be surrounded by background material 175. Background material 175 may have adjacent thereto a specular reflector 155, the reflector 155 being distal to the sapphire layer 120. The combination of reflector 155, background material 175, and the plurality of scattering elements 160 make up metasurface 110. In other variations a metasurface 110 may lack the specular reflector.

The plurality of scattering elements 160 may be formed or placed in the background material 175 adjacent to sapphire layer 120. Scattering elements 160 may be formed of any height and width and may be centered on the period of the wavelength in use, such as approximately 450 nm for blue light. The height and width may be configured to create the desired scattering of incident light, such as in order to maximize light directed out through the sides walls of sapphire layer 120. The scattering elements may be formed as silicon (Si) or titanium oxide ($TiO_2$), or a combination thereof, for example.

Background material 175 may be a low refractive index material, such as magnesium fluoride ($MgF_2$), for example.

Reflector 155 may be a specular reflector. Reflector 155 may be a metal mirror, for example a gold or silver mirror, a dielectric mirror, or a Bragg reflector, for example. Reflector 155 may have a determinate phase relation between incident and output fields.

Figure 1C:
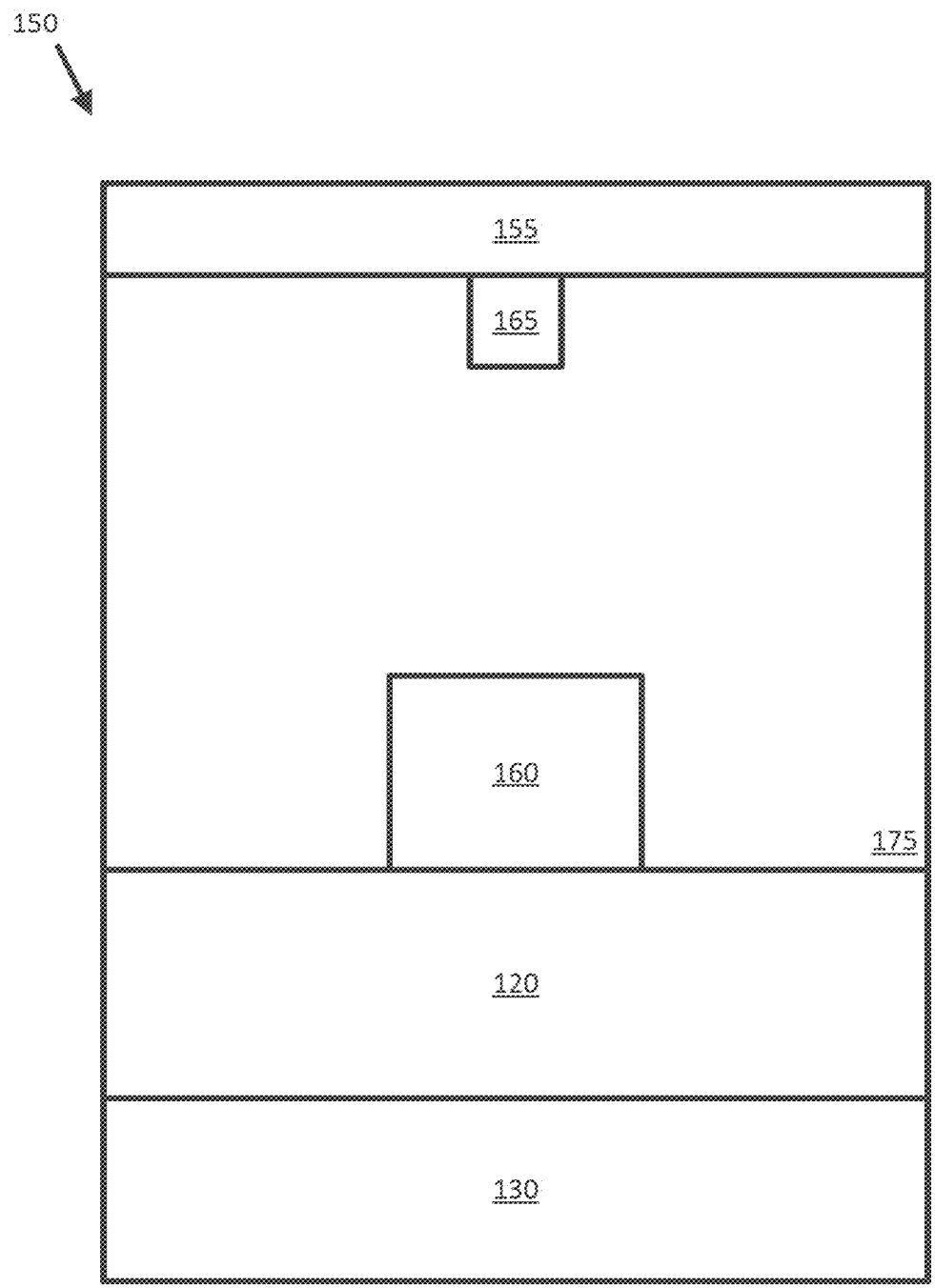
FIG. 1C illustrates an example unit cell of an example metasurface, for example that of FIG. 1B.

FIG. 1C illustrates an example unit cell 150 of the reflective beam-bender of metasurface 110 of FIG. 1B. Unit cell 150 may be rectangular in dimensions of $d_x$ and $d_y$ in the X and Y directions (shown in coordinate independent design as din FIG. 1C). Unit cell 150 includes a series of layers including a reflector 155 and background material 175. A first scattering element 160 may be positioned adjacent to substrate layer 170 distal to reflector 155. Scattering element 160 may take the form of any of the scattering elements described herein. Scattering elements 160 may be referred to herein as nanoantennas.

An optional scattering element 165 may be positioned within background material 175. As shown, optional scattering element 165 may be positioned such that one edge of optional scattering element 165 is in contact, or near contact, with a surface of reflector 155. As would be understood by those possessing an ordinary skill in the pertinent arts, this location for the position of optional scattering element 165 is illustrative only, as optional scattering elements 165 may be positioned at any location and orientation within background material 175.

First scattering element 160 may be formed or placed adjacent to substrate 120. First scattering element 160 may be formed in any height and width as defined by the interaction with the light emitted from sapphire layer 120. First scattering element 160 may be designed to interact with both electric and magnetic fields within device 100. First scattering element 160 may scatter light asymmetrically.

Optional scattering element 165 may be formed similar to first scattering element 160. That is, optional scattering element 165 may be identical to first scattering element 160 and/or selected from the same scattering elements as first scattering element 160. While optional scattering element 165 is described as being optional, it is contemplated that optional scattering element 165 may be included in an LED device without the need for first scattering element 160 being included.

Figure 1D:
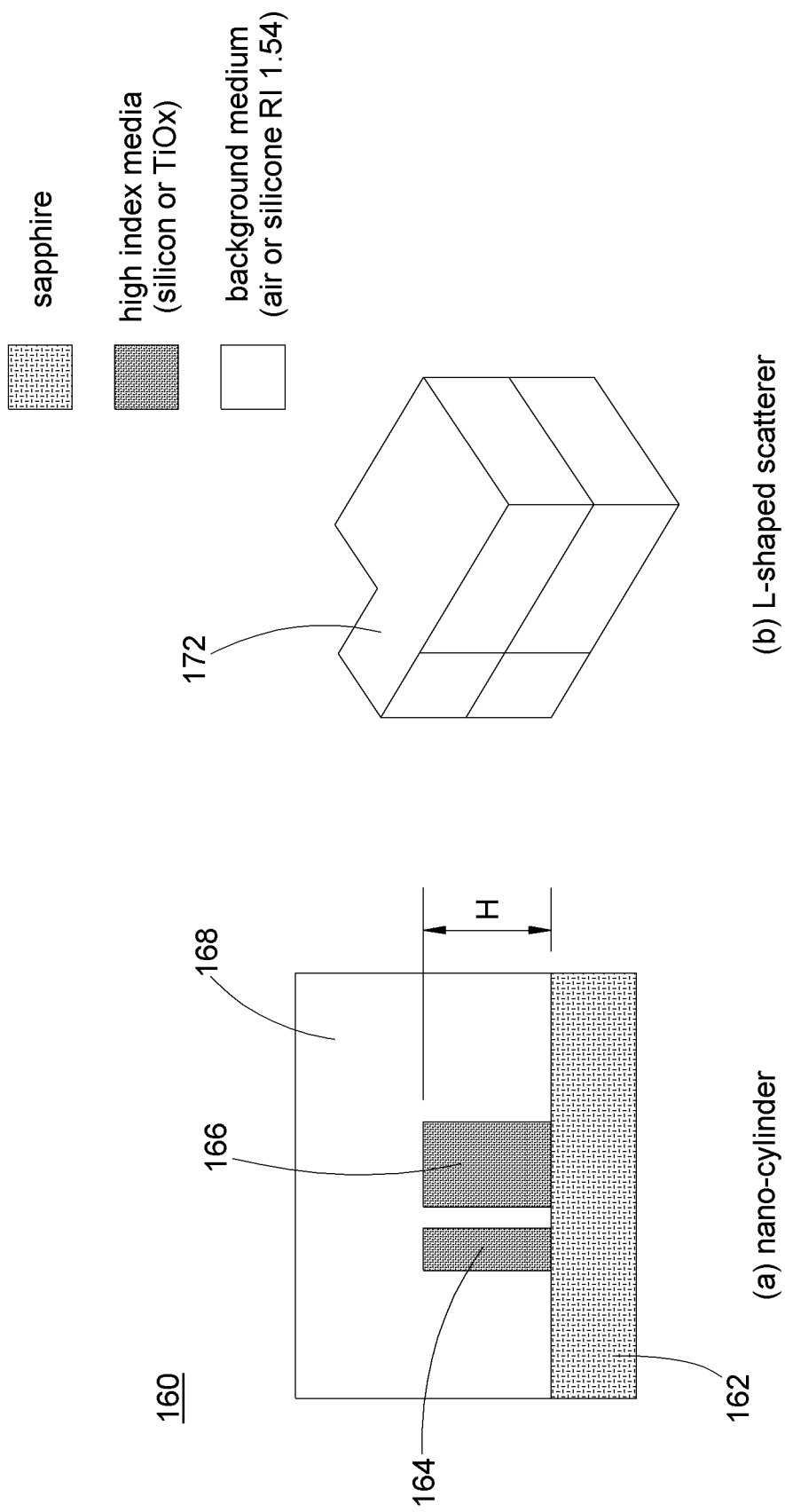
FIG. 1D illustrates example scattering elements that may be used in the example cell unit of FIG. 1C.

Example scattering elements, such as first scattering element 160 and/or optional scattering elements 165, are illustrated in FIG. 1D. The scattering element may be designed as two interfering Huygen's meta-atoms. The scattering elements may be selected to satisfy the first Kerker's conditions so that the magnetic and electric dipole radiation cancel in the backward direction yielding a large forward scatter, referred to as Huygen's meta-atoms.

The scattering elements may also be formed from photonic metamaterial (PM), also known as an optical metamaterial, which is a type of electromagnetic metamaterial that interacts with light, covering terahertz (THz), infrared (IR) or visible wavelengths. The materials employ a periodic, cellular structure. The subwavelength periodicity distinguishes photonic metamaterials from photonic band gap or photonic crystal structures. The cells are on a scale that is magnitudes larger than atoms, yet much smaller than the radiated wavelength, and are on the order of nanometers. In metamaterials, cells take the role of atoms in a material that is homogeneous at scales larger than the cells, yielding an effective medium model.

As illustrated in FIG. 1D, the scattering elements 160 (and scattering element 165) may be formed as a two-dimensional scatterer, such as a grating, for example, or a three-dimensional scatter. An example three-dimensional scatter may be a nanocylinder. The scattering elements, such as the nanocylinder, may include a substrate layer 162 that may be formed from sapphire in order to more easily bond or form with the sapphire layer 170 of the unite cell 150. A high index media, such as silicon or titanium oxide ($TiO_2$) may be used to form cylinders 164 and 166. Cylinders 164, 166 may be surrounded by a background medium 168. Background medium may be formed from air or silicone with a reactive index of approximately 1.54. Other geometrical scatterers may also be employed includes L-shaped scatterer 172, for example.

Asymmetrical scattering may be achieved by using asymmetric cylinders of height H. Height H may be designed to link the reflected fields from the reflector 155 to the scattered fields from first scattering elements 160. Interference between these fields causes light to be scattered in a particular direction.

For example, normal incidence light can be scattered to large oblique angles. An example can be achieved at 840 nm using two silicon particles (for cylinders 164, 166 both of height H=250 nm and radii 90 and 150 nm spaced apart 30 nm. The particles are set on a silica substrate 162 of height 420 nm.

Figure 1E:
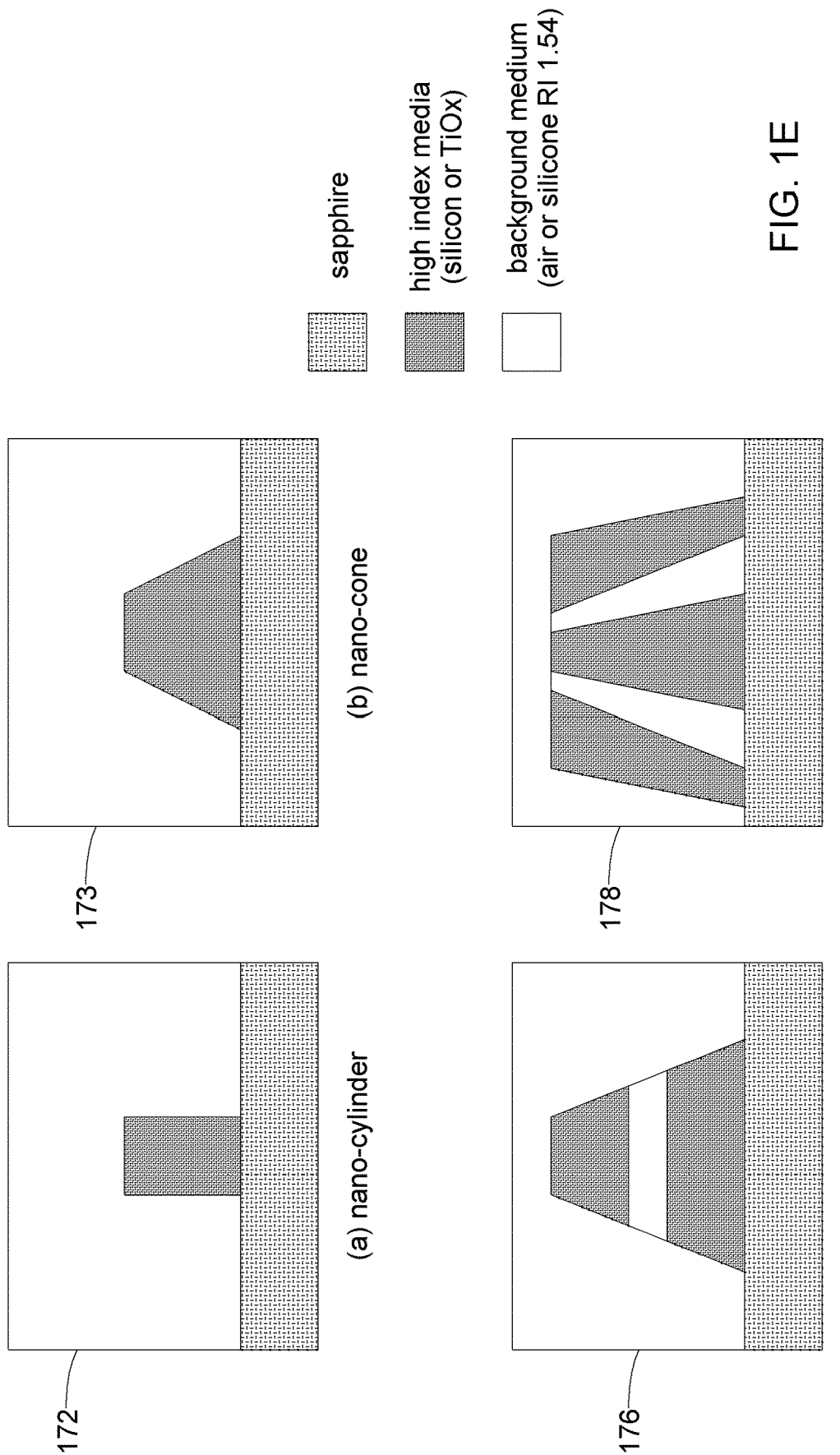
FIG. 1E illustrates various cross-sections of example scattering elements.

The scattering elements may be combined to produce a reflective metasurface 110 composed with spatial gradient of phase. FIG. 1E illustrates various cross-sections of some different possible scattering elements. The scattering elements or nanoantenna may be formed from nanocylinders 172 (detailed FIG. 1D) illustrated in FIG. 1E(a), nanocones 173 illustrated in FIG. 1E(b), or nanocuboids 176, 178 illustrated in FIG. 1E(c,d) arranged for example in either a hexagonal or a rectangular lattice. The lattice period may be sub-wavelength or larger than wavelength. The scattering elements may be Huygen's meta-atoms or support waveguide modes. In the cases of the nanocylinder vertical dimer 176 (FIG. 1E(c)) and coaxial dimer 178 (FIG. 1E(d)), interfering modes within the meta-atom or nanoantenna provide additional control of the scattered modes using structural parameters.

A nanoantenna may comprise a single scatterer (a single dipole), or an array of scatterers (dipoles) that may be configured analogously to a yagi-uda antenna, for example.

Figure 1F:
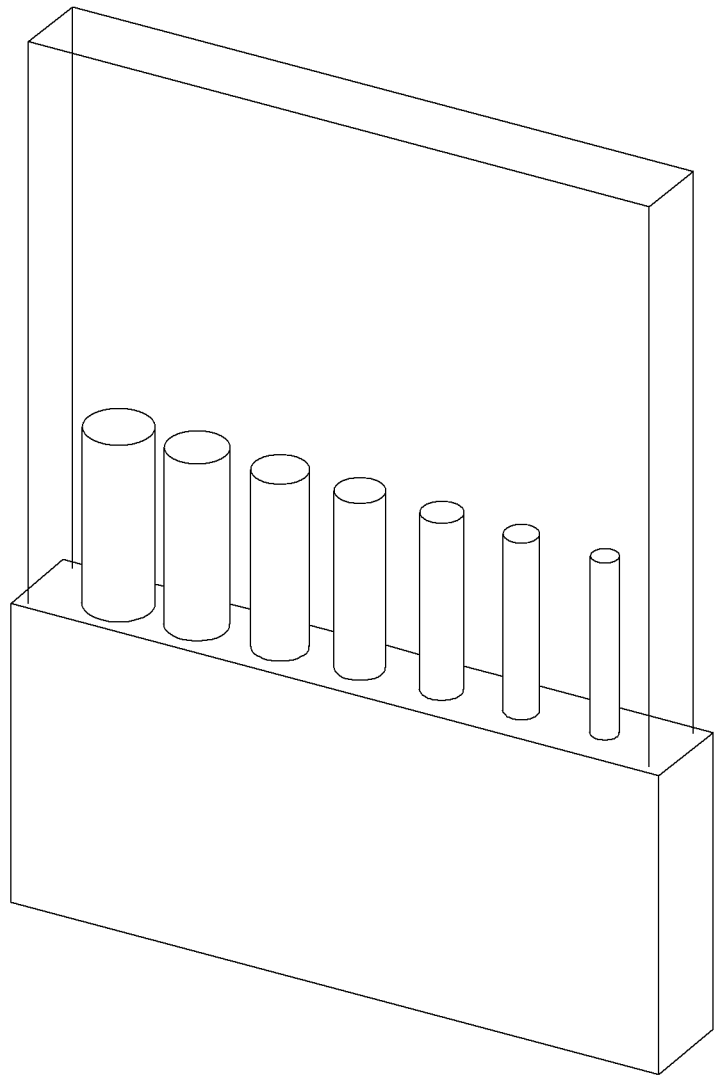
FIG. 1F illustrates a meta-unit cell formed from the scattering elements such as those of FIGS. 1D, 1E, for example.

The scattering elements may be formed into, or arrayed, into simple meta-unit cells. FIG. 1F illustrates an example meta-unit cell 190. Each small meta-unit cell 190 of metasurface 110 may provide beam bending to the light incident on metasurface 110. By suitably placing a multitude of different meta-unit cells 190, with different beam bending properties, on the LED exit surface (the surface of sapphire layer 120 adjacent to metasurface 110), the light may be shaped to the required angular distribution. Placement and configuration of the meta-unit cells may be optimized based on achieving a desired metric for LED performance. For example, the design and placement within metasurface 110 may selected by an optimizer to obtain the best possible flux from the LED device 100. Multi-functionality, such as wavelength filtering and/or angle filtering (described in detail herein) may be incorporated into the metasurface 110.

Figure 1G:
FIG. 1G illustrates an LED with an embodiment of the metasurface positioned on the sidewalls to deflect select incident angled light from the semiconductor die or chip towards the sapphire exit surface.
Figure 1G:
Figure 1G:
Figure 1G:
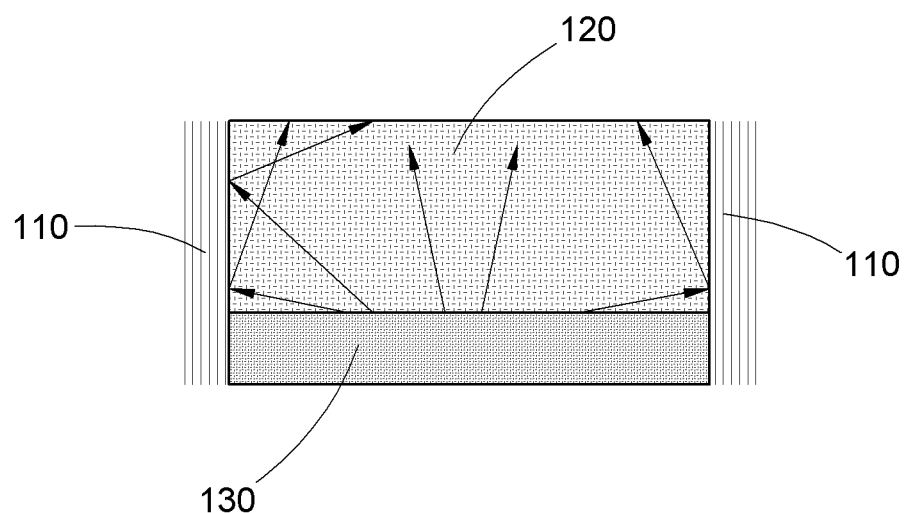

FIG. 1G illustrates an LED 100 with the metasurface 110 positioned on the sidewalls to deflect select incident angled light from the semiconductor die or chip 130 towards the sapphire layer 120 exit surface. This deflection of the incident angled light improves the extraction efficiency and increases the flux output from the LED. A metasurface, as described hereinabove may be designed to deflect the light. Such a metasurface may be used to coat the sidewalls of the sapphire surface to deflect the incident angled light.

The sidewalls of the sapphire layer 120 may be coated with the reflective metasurface 110. The regions of the sapphire sidewall closer to the GaN region having light impinging at normal or close to normal incidences may benefit from the use of the metasurface. The reflective metasurface 110 in this embodiment may be designed to bend the incident light towards the exit surface and prevent the light from bouncing around the sapphire layer and eventually getting absorbed. This increases efficiency of the overall device. The reflector is also thin (order of wavelength of light) and can be designed to have low loss of operation. Further, this embodiment may be applied to other configurations, such as a ceramic phosphor layer, where the light impinges on the sidewall at normal or close to normal incidence. The metasurface 110 may be designed with multi-functionality including wavelength filtering, angle filtering, for example.

Similar to the structure described above with respect to FIG. 1A, LED 100 may be an LED blue emitter. The chip 130 may be a CSP die with smooth sidewall surfaces may be used as substrate material for the photonic layer. Sapphire layer 120 may be as described above. Metasurface 110 may be a nanostructured photonic layer to steer angular radiation. Metasurface 110 may be formed from photonic crystal, metamaterial, metasurface and/or subwavelength gratings of asymmetric nanoantennas.

According to this embodiment, a function of metasurface 110 may be to reflect radiation incident upon the sapphire surface from a given angular range to a chosen angular range. This restricted angular range is chosen to extract as much light as possible from the top of the LED. For example, the light incident normally on the photonic surface will be reflected to large oblique angles such that it can escape from the top of the sapphire. The aim is to prevent photons from bouncing around in the sapphire and try to extract them as quickly as possible.

A reflective metasurface 110 composed of reflective beam-benders in periodic 2-dimensional grating shown above in FIG. 1B, 1C. The reflector 155 in FIG. 1C may be a specular reflector and may be a metal mirror or a photonic dielectric mirror. Additionally, reflector 155 may have a determinate phase relation between incident and output fields.

Scattering elements 160 may be designed to interact with both electric and magnetic fields. And may scatter light asymmetrically. Examples of scattering elements 160 are illustrated and discussed with respect to FIG. 1D. For example, scattering elements 164 and 166 may be two interfering Huygen's meta-atoms. Scattering elements 160 may be 3-dimensional (nanocylinders) or 2-dimensional (gratings). The asymmetrical scattering may be achieved by using asymmetric particles, as illustrated, for example in FIG. 1D. The height H may be designed to link the reflected fields from the reflector to the scattered fields from the top scatterer, such as scattering element 165, for example. Interference between scattering elements 160, 165 may cause light to be scattered in only a particular direction. For example, normal incidence light may be scattered to large oblique angles. An example can be achieved at 840 nm using two silicon particles as scattering elements 160, 165, both of height 250 nm and radii 90 and 150 nm spaced apart 30 nm. The particles are set on a silica substrate of height 420 nm. Scatter elements 160 on the bottom reflector plane is optional and can provide additional control of radiation. A reflective metasurface 110 may be composed with spatial gradient of phase. The nanoantenna of metasurface 110 are described above with respect to FIGS. 1E and 1F. Each small meta-unit cell of the metasurface 110 may present a certain amount of beam bending to the incident light. By suitably placing a multitude of different meta-unit cells of metasurface 110, with different beam bending properties, on the LED sapphire layer 120 sidewall surface, the incident beam may be shaped to the required angular distribution. The design and placement may be chosen by an optimizer to obtain the best possible flux from the LED.

Figure 1H:
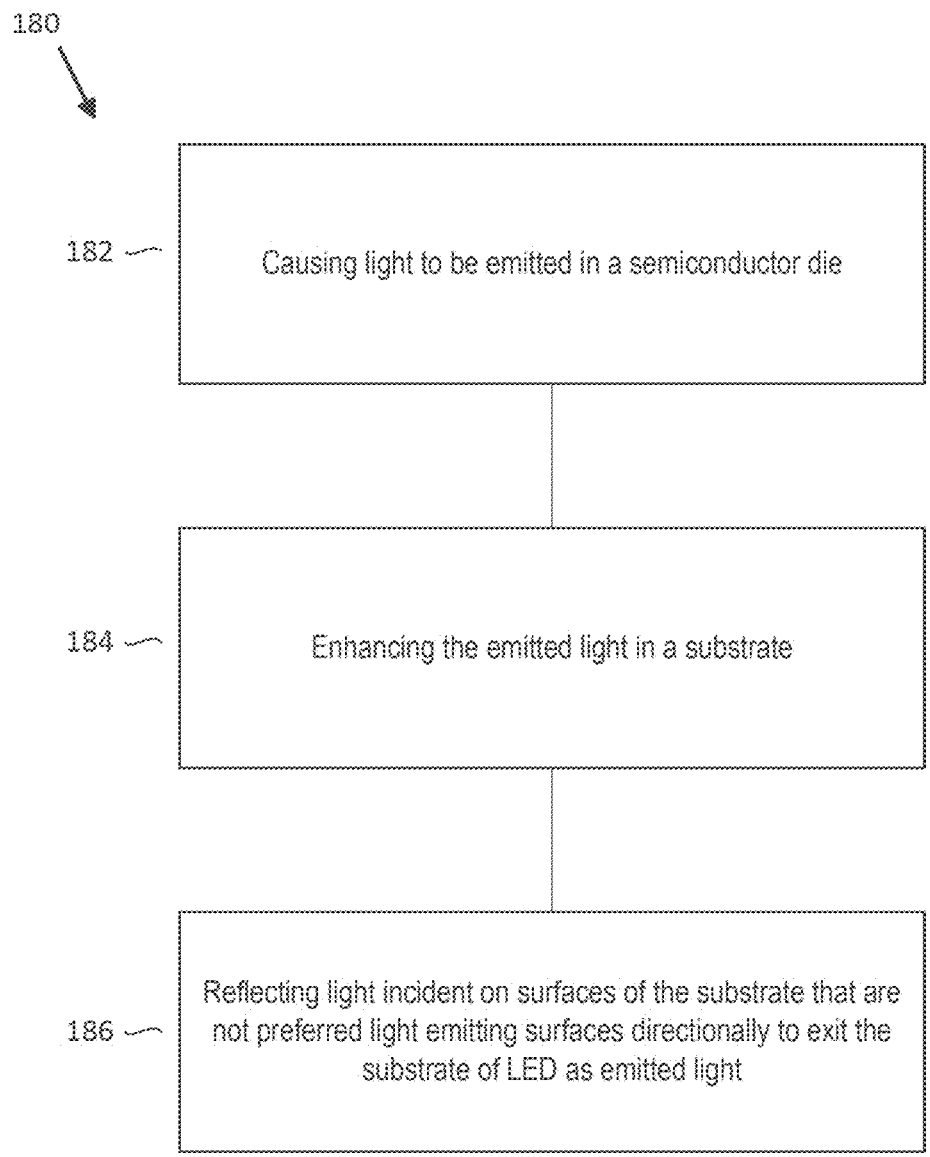
FIG. 1H illustrates a method for enhancing an LED device.

FIG. 1H illustrates a method 180 for enhancing an LED device. The method includes causing light to be emitted in a semiconductor die at step 182, enhancing the emitted light in a substrate at step 184, and reflecting light incident on surfaces of the substrate that are not preferred light emitting surfaces directionally to exit the substrate of LED as emitted light at step 186. As described in embodiments, a reflective metasurface may reflect light in the substrate incident upon the reflective metasurface out from the sidewalls of the substrate. As described in embodiments, a reflective metasurface reflecting light in the substrate incident upon the reflective metasurface out from the substrate surface distal to the semiconductor die.

Figure 2A:
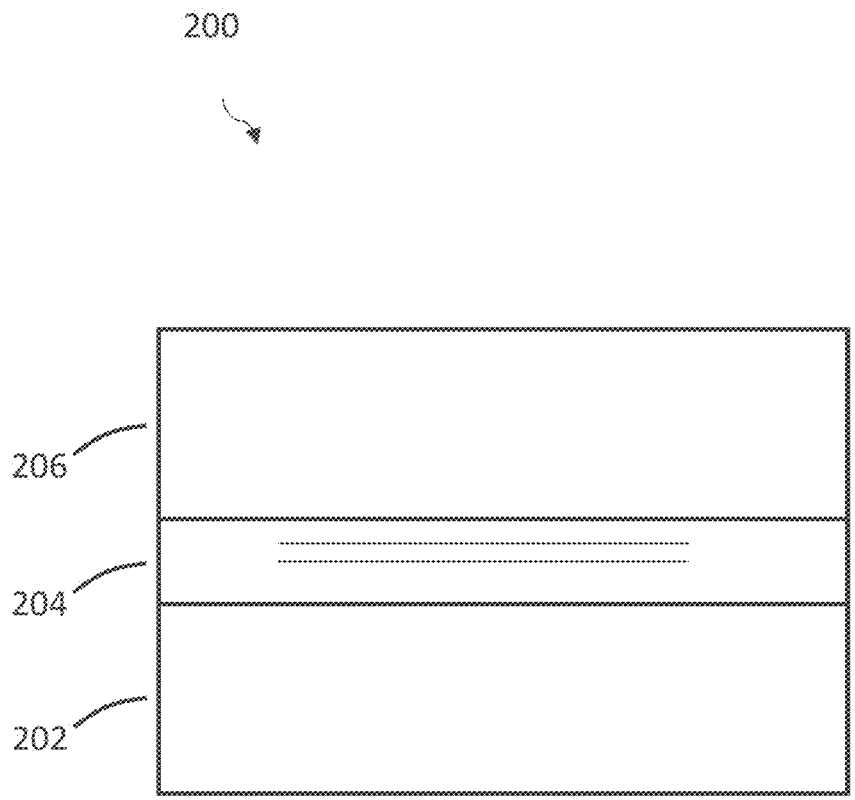
FIG. 2A is a diagram of an LED device in an example embodiment.

FIG. 2A is a diagram of an LED device 200 in an example embodiment of an LED device that may employ high brightness side emitting blue led with photonic converter of angular momentum and/or led with non-specular sidewall photonic thin film reflector. The LED device 200 may include one or more epitaxial layers 202, an active layer 204, and a substrate 206. In other embodiments, an LED device may include a wavelength converter layer and/or primary optics. As shown in FIG. 2A, the active layer 204 may be adjacent to the substrate 206 and emit light when excited. The epitaxial layers 202 may be proximal to the active layer 204 and/or one or more intermediate layers may be between the active layer 204 and epitaxial layers 202. The substrate 206 may be proximal to the active layer 204 and/or one or more intermediate layers may be between the active layer 204 and substrate 206. The active layer 204 emits light into the substrate 206.

Figure 2B:
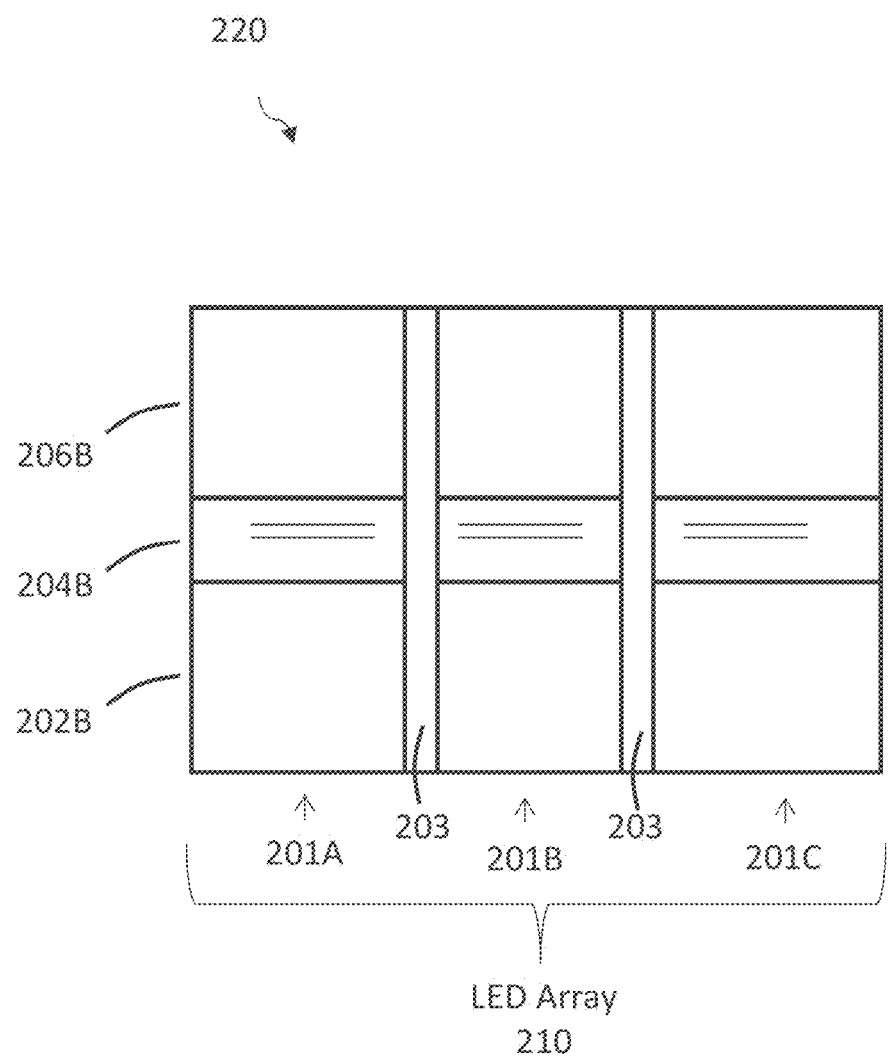
FIG. 2B shows a cross-sectional view of a lighting system including an LED array with pixels.

FIG. 2B shows a cross-sectional view of a lighting system 220 including an LED array 210 with pixels 201A, 201B, and 201C. The LED array 210 includes pixels 201A, 201B, and 201C each including a respective substrate 206B active layer 204B and an epitaxial layer 202B. Pixels 201A, 201B, and 201C, in the LED array 210 may be formed using array segmentation, or alternatively using pick and place techniques and may, for example, emit light at different peak wavelengths such as red, green, and blue. The spaces 203 shown between one or more pixels 201A, 201B, and 201C may include an air gap or may be filled by a material such as a metal material which may be a contact (e.g., n-contact). According to some embodiments, secondary optics such as one or more lenses and/or one or more waveguides may be provided.

The LED device 200 or pixels 201A, 201B, and 201C may be single wavelength emitters and may be powered individually or via as an array. The LED device 200 or pixels 201A, 201B, and 201C may be part of an illumination system that includes one or more electronics boards, power modules, sensors, connectivity and control modules, LED attach regions, or the like. Pixels in an array may be powered based on different channel signals and their operation may be determined by a microcontroller.

Figure 3:
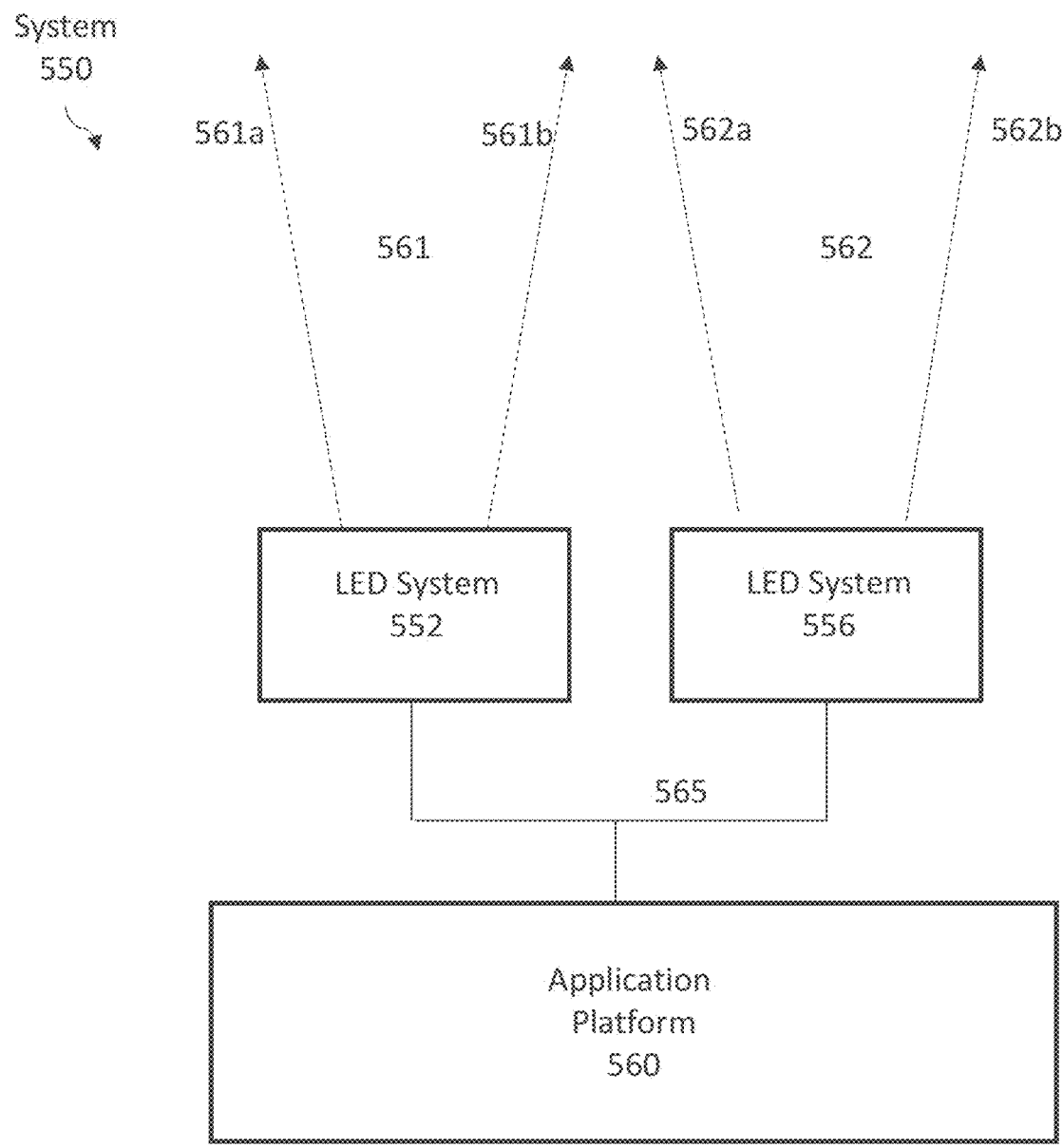
FIG. 3 shows an example system which includes an application platform and LED systems.

FIG. 3 shows an example system 550 which includes an application platform 560 and LED systems 552 and 556. The LED System 552 produces light beams 561 shown between arrows 561a and 561b. The LED System 556 may produce light beams 562 between arrows 562a and 562b. As an example embodiment, the LED system 552 and 556 may be part of an automobile and may emit infrared (IR) light communication beams such that an oncoming vehicle in the path of the light beams 561 and/or 562 is able to receive communication from the automobile. In example embodiments, the system 550 may be a mobile phone of a camera flash system, indoor residential or commercial lighting, outdoor light such as street lighting, an automobile, a medical device, AR/VR devices, and robotic devices.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560.

In various embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

Although features and elements are described above in particular combinations, one of ordinary skill in the art will appreciate that each feature or element can be used alone or in any combination with or without the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A light emitting device comprising:
   a semiconductor diode structure configured to emit light;
   a substrate that is transparent to light emitted by the semiconductor diode structure and comprises a top surface on which the semiconductor diode structure is disposed, a bottom surface positioned opposite from the top surface, and sidewall surfaces extending between the top and bottom surfaces; and
   a reflective nanostructured layer disposed on or adjacent to at least one sidewall surface of the substrate and configured to reflect toward and through the bottom surface of the substrate light emitted by the semiconductor structure and incident on the reflective nanostructured layer at angles at or near perpendicular incidence.

2. The light emitting device of claim 1, wherein the reflective nanostructured layer is or comprises a photonic crystal.

3. The light emitting device of claim 1, wherein the reflective nanostructured layer is or comprises a metamaterial or metasurface.

4. The light emitting device of claim 1, wherein the reflective nanostructured layer is or comprises a grating of asymmetric nanoantennas having a period less than or equal to a wavelength of light emitted by the semiconductor diode structure.

5. The light emitting device of claim 4, wherein at least one asymmetric nanoantenna is a single asymmetric light scattering object.

6. The light emitting device of claim 4, wherein at least one asymmetric nanoantenna comprises two or more light scattering objects in an asymmetric arrangement.

7. The light emitting device of claim 1, wherein the reflective nanostructured layer has a thickness perpendicular to the sidewall surface of the substrate that is less than or equal to a wavelength of light emitted by the semiconductor diode structure.

8. The light emitting device of claim 1, wherein:
   the reflective nanostructured layer comprises a specular reflector, a dielectric layer disposed between the specular reflector and the substrate, and a periodic arrangement of nanoantennas disposed between the specular reflector and the substrate and spaced apart from the specular reflector by the dielectric layer; and
   each nanoantenna scatters light asymmetrically.

9. The light emitting device of claim 8, wherein at least one nanoantenna is a single asymmetric light scattering object.

10. The light emitting device of claim 8, wherein a first one of the nanoantennas and a second one of the nanoantennas differ in size, shape, or size and shape.

11. The light emitting device of claim 8, wherein at least one nanoantenna comprises two or more light scattering objects in an asymmetric arrangement.

12. The light emitting device of claim 11, wherein the two or more light scattering objects are each individually symmetric.

13. The light emitting device of claim 12, wherein the two or more light scattering objects are each of the same shape but are of different sizes.

14. The light emitting device of claim 11, wherein at least one of the two or more light scattering objects is asymmetric.

15. The light emitting device of claim 11, wherein the two or more light scattering objects are disposed in a periodic arrangement.

16. The light emitting device of claim 11, wherein the two or more light scattering objects are disposed in an aperiodic arrangement.

* * * * *